United States Patent
Oh et al.

(10) Patent No.: US 11,187,397 B2
(45) Date of Patent: Nov. 30, 2021

(54) LED LIGHTING APPARATUSES FOR BACKLIGHT UNIT OF A DISPLAY

(71) Applicant: LUMENS CO., LTD., Yongin-si (KR)

(72) Inventors: Seunghyun Oh, Yongin-si (KR); Pyoynggug Kim, Yongin-si (KR); Sungsik Jo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 17/152,140

(22) Filed: Jan. 19, 2021

(65) Prior Publication Data

US 2021/0254809 A1   Aug. 19, 2021

(30) Foreign Application Priority Data

Feb. 18, 2020   (KR) .......................... 10-2020-0020000

(51) Int. Cl.
| | |
|---|---|
| *F21V 3/00* | (2015.01) |
| *F21V 9/40* | (2018.01) |
| *H01L 25/075* | (2006.01) |
| *H01L 33/32* | (2010.01) |
| *H01L 33/46* | (2010.01) |
| *H01L 33/62* | (2010.01) |

(Continued)

(52) U.S. Cl.
CPC .................. *F21V 3/00* (2013.01); *F21V 9/40* (2018.02); *H01L 25/0753* (2013.01); *H01L 33/32* (2013.01); *H01L 33/46* (2013.01); *H01L 33/62* (2013.01); *F21Y 2105/10* (2016.08); *F21Y 2115/10* (2016.08)

(58) Field of Classification Search
CPC ... F21V 3/00; F21V 9/40; H01L 33/46; H01L 25/0753; H01L 33/62; H01L 33/32; F21Y 2115/10; F21Y 2105/10

See application file for complete search history.

(56) References Cited

U.S. PATENT DOCUMENTS

| | | | |
|---|---|---|---|
| 2011/0215346 A1* | 9/2011 | Yoon | H01L 27/156 257/88 |
| 2013/0145588 A1* | 6/2013 | Nakata | H01L 25/0753 29/25.01 |
| 2018/0286915 A1* | 10/2018 | Yeon | H01L 27/153 |

(Continued)

*Primary Examiner* — Tracie Y Green
(74) *Attorney, Agent, or Firm* — Mei & Mark LLP (57) ABSTRACT

An LED display lighting device is disclosed. The LED display lighting device includes: a substrate including a substrate base and a first electrode part and a second electrode part, both of which are disposed on the substrate base; a plurality of LED chips arranged in a matrix on the substrate; and a diffusion plate covering the upper portions of the LED chips. Each of the LED chips includes: a light-transmitting base; n LED cells disposed under the light-transmitting base and each including a first conductive semiconductor layer, an active layer, and a second conductive semiconductor layer; an interconnection through which the n LED cells are connected in series; a first electrode structure through which the first conductive semiconductor layer of the first LED cell is connected to the first electrode part; and a second electrode structure through which the second conductive semiconductor layer of the n-th LED cell is connected to the second electrode part. The sum of the areas of the active layers of the n LED cells is at least 50% of the area of the light-transmitting base.

18 Claims, 8 Drawing Sheets

(51) Int. Cl.
*F21Y 105/10* (2016.01)
*F21Y 115/10* (2016.01)

(56) References Cited

U.S. PATENT DOCUMENTS

2018/0350872 A1* 12/2018 Choi .................. F21K 9/235
2019/0371779 A1* 12/2019 Yeon ................. H01L 25/18
2020/0212017 A1* 7/2020 Oh .................... H01L 33/62

* cited by examiner

LED LIGHTING APPARATUSES FOR BACKLIGHT UNIT OF A DISPLAY

BACKGROUND OF THE INVENTION

1. Field of the Invention

The present invention relates to a display lighting device, and more specifically to an LED display lighting device that is capable of local dimming and has an improved contrast ratio, thus being suitable for use in a backlight unit.

2. Description of the Related Art

LED lighting devices are known in which a plurality of LEDs are arranged directly under a planar object. The LED lighting devices are used in various applications, including general lighting systems and backlight units of displays. Local dimming is applied to the LED lighting devices, particularly LED display lighting devices.

Figure 1:
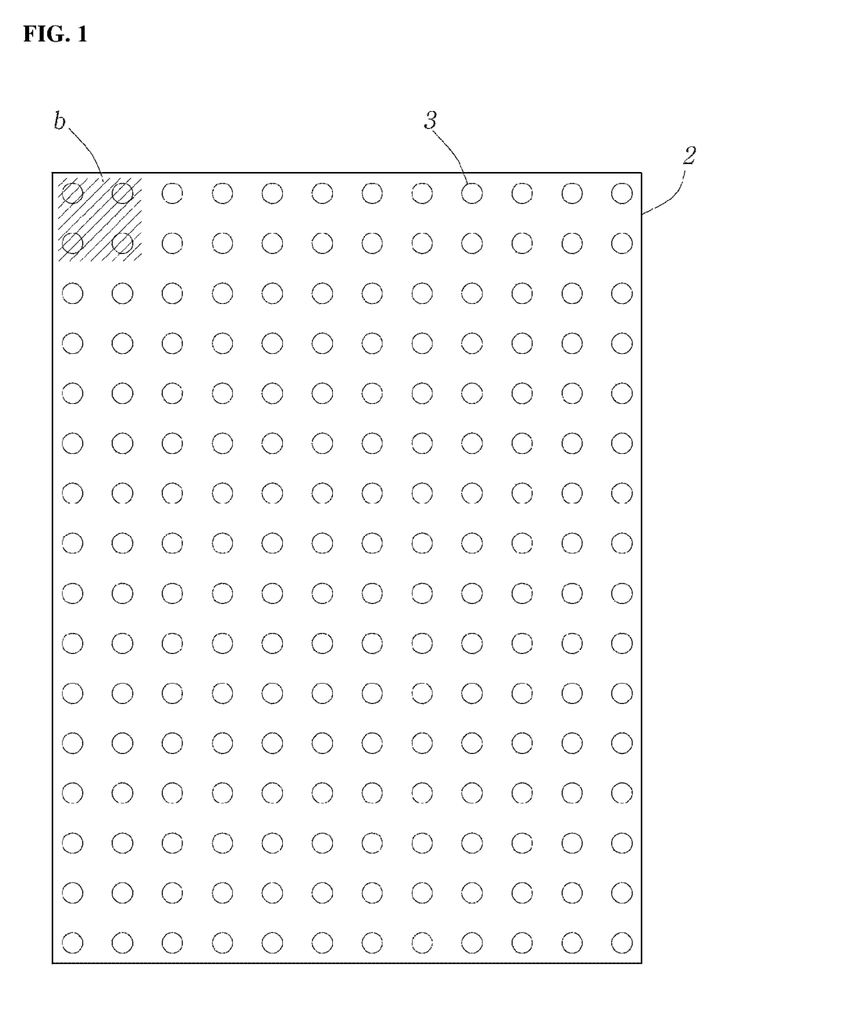
FIG. 1 illustrates the prior art.

FIG. 1 illustrates a conventional LED display lighting device capable of local dimming. In FIG. 1, optical members such as a diffusion plate are omitted. As illustrated in FIG. 1, the conventional LED display lighting device includes a plurality of LED packages 3 mounted on a printed circuit board (PCB) 2.

In the conventional LED display lighting device, each of the LED packages 3 includes an LED chip accommodated in a package body including lead frames and a lens coupled to an opening of the package body to cover the LED chip. The lens increases the radiation angle of light emitted through the narrow opening of the package body. A relatively small number of the LED packages are used in the conventional LED display lighting device, but the long distance between the LED packages and the diffusion plate (i.e. optical distance) inevitably leads to an increase in the thickness of the device and an increase in the size of a local dimming block b, which is indicated by a hatched square in FIG. 1. The conventional LED display lighting device may be used in a backlight unit. In this case, the size of the local dimming block is usually about 780 mm².

The disadvantages of the conventional LED display lighting device are summarized as follows.

The conventional LED display lighting device based on light diffusion through the lenses of the LED packages has limitations in reducing the size of the local dimming block and decreasing the optical distance depending on the height of the lenses. Further, the package manufacturing process and the SMT process increase the overall time to fabricate the device. Moreover, since each of the LED chips of the LED packages has a single-cell structure including one active layer, all interconnections between the LED packages are formed in the PCB, making the structure of the PCB complicated and inevitably resulting in an increase in the thickness of a power cable.

SUMMARY OF THE INVENTION

An object of the present invention is to provide an LED display lighting device having a new structure that avoids the problems of the prior art.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention. It should also be noted that the term "match", "matching" or "matches" as used herein should not be construed as being limited to the meaning of exact matching and is construed as allowing a tolerance.

Figure 2:
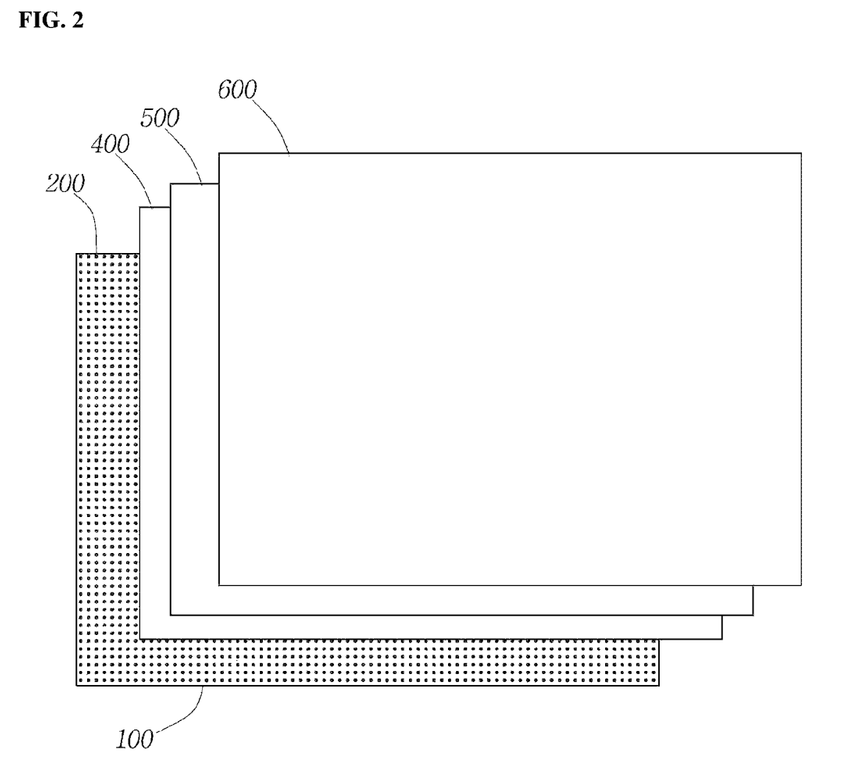
FIGS. 2 and 3 illustrate the overall structure of an LED display lighting device of the present invention.
Figure 3:
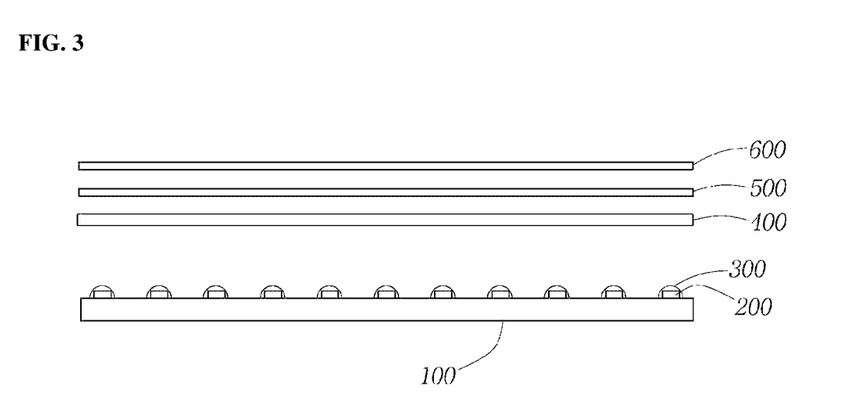
Figure 4:
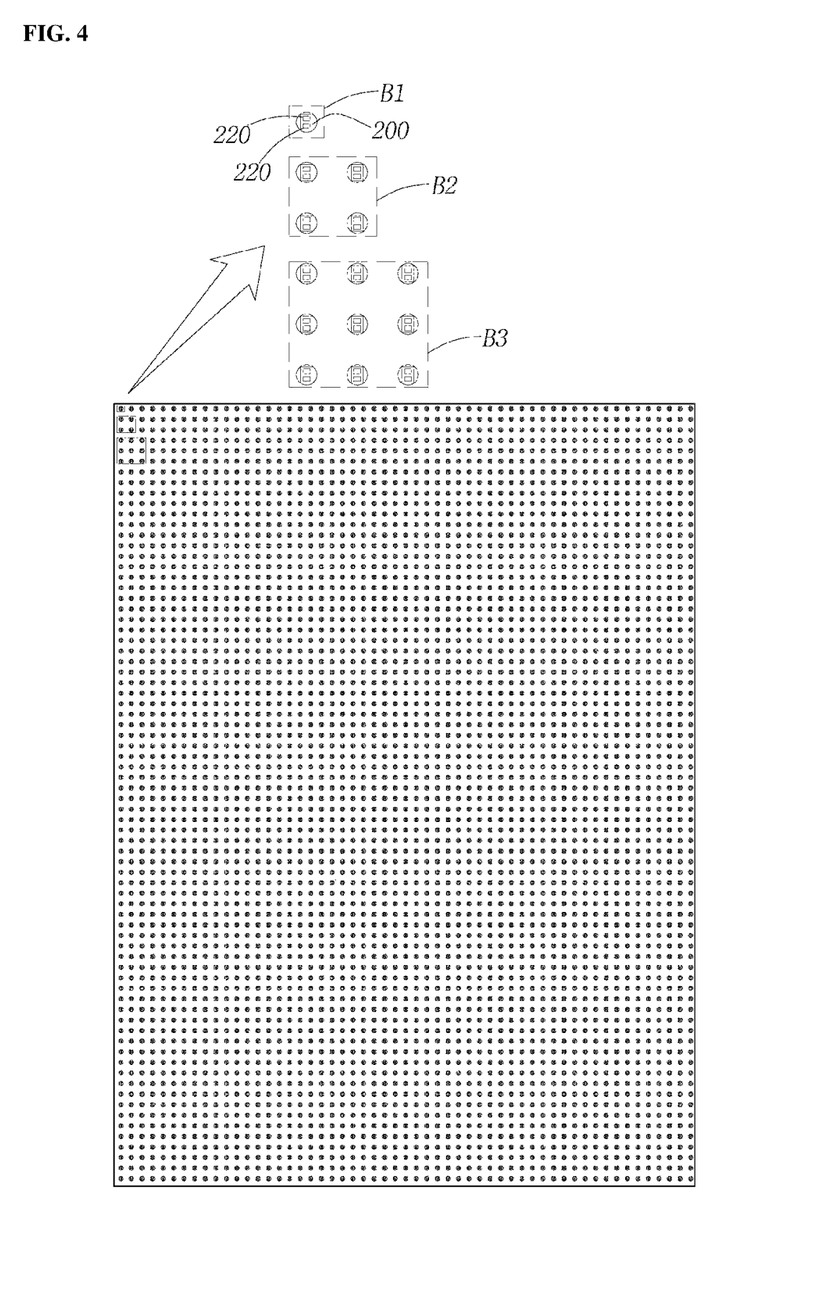
FIG. 4 is a plan view illustrating a substrate and LED chips arranged on the substrate in an LED display lighting device of the present invention, explaining variable sizes of local dimming blocks.

FIGS. 2 and 3 illustrate the overall structure of an LED display lighting device of the present invention, and FIG. 4 is a plan view illustrating a substrate and LED chips arranged on the substrate in the LED display lighting device, explaining variable sizes of local dimming blocks.

The LED display lighting device of the present invention is advantageously applicable to a direct type backlight unit of a display that is capable of local dimming Referring to FIGS. 2 to 4, the LED display lighting device includes a substrate 100, a plurality of LED chips 200 arranged in a matrix on the substrate 100, and a diffusion plate 400 arranged in parallel to the substrate 100 to cover the upper portions of the LED chips 200.

The LED display lighting device may further include an encapsulation material 300 formed on the substrate 100 to encapsulate the LED chips 200 individually or wholly. The LED display lighting device may further include a color change film 500 arranged on the diffusion plate 400 to change the color of light emitted from the LED chips 200 and an optical sheet 600 arranged on the color change film 500 to secondarily diffuse the primarily diffused light from the diffusion plate 400.

The order of arrangement of the optical elements, including the diffusion plate 400, the color change film 500, and the optical sheet 600, may vary. One or more other optical elements may be added or one or more of the above-mentioned optical elements may be omitted.

The LED chips 200 are directly mounted on the substrate 100 without being packaged. The LED chips 200 are mini-LED chips, each of which has at least one side whose length is not greater than 200 μm. Each of the LED chips 200 has a width of 450 μm and a length of 200 μm. Each of the LED chips 200 has a multi-cell structure including n LED cells integrally connected in series with each other.

When each of the LED chips 200 is directly mounted on the substrate without being packaged, is a mini-LED chip having at least one side whose length is not greater than 200 μm, more preferably a width of 450 μm or less and a length of 200 μm or less, and has a multi-cell structure in which a plurality of LED cells 220 are connected in series with each other, the optical distance (O/D) from the upper surface of the substrate 100 to the lower surface of the diffusion plate 400 can be reduced to 1 mm or less and the size of the local dimming block can be reduced to approximately 30 mm² corresponding to the area of one LED chip 200. The size of the local dimming block can be minimized by controlling the number of LED cells turned on in the mini-sized LED chips 200. In FIG. 4, a local dimming block B1 including only one LED chip, a local dimming block B2 including four LED chips, and a local dimming block B3 including nine LED chips are illustrated. Each of the LED chips includes n LED cells.

Table 1 shows a comparison between the present invention and the prior art.

TABLE 1

|  | Prior art | Inventive |
|---|---|---|
| Light source structure | LED package including lens | Mini-LED chip having multi cells 450 μm × 200 μm |
| Dimming block size | 780 mm² | ~30 mm² |
| Comparison | | High contrast ratio High degree of freedom of block construction |

Figure 5:
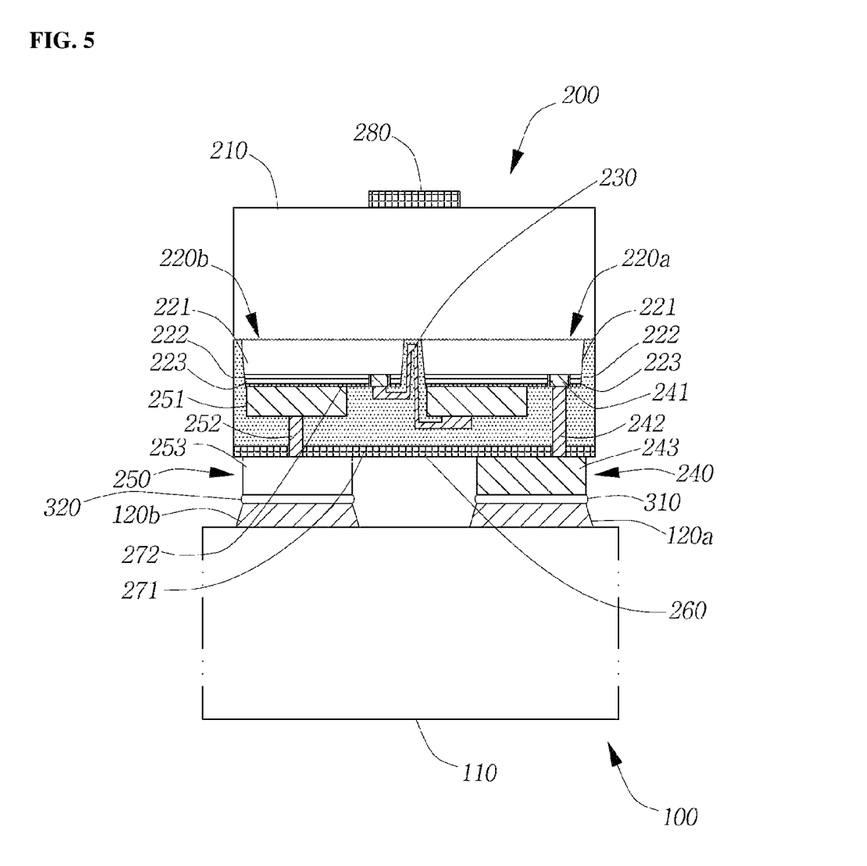
FIG. 5 is a schematic cross-sectional view illustrating one example of an LED chip of an LED display lighting device according to the present invention.
Figure 6:
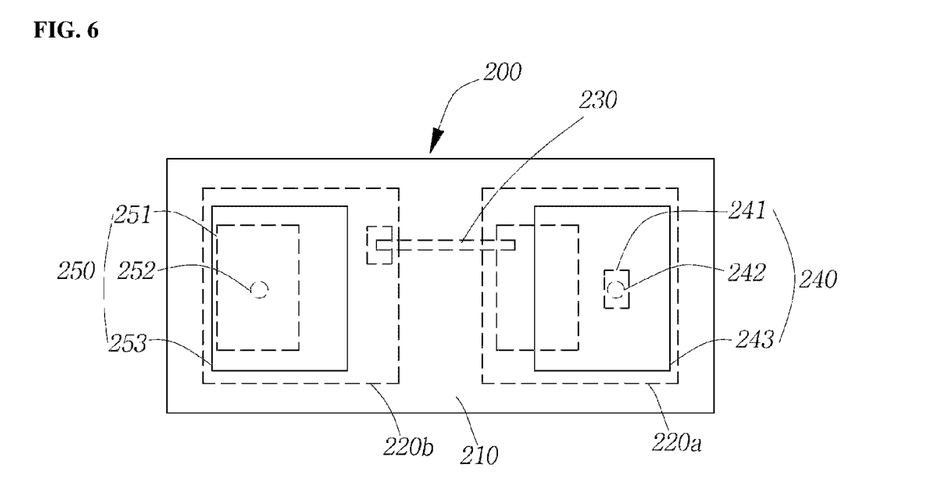
FIG. 6 is a schematic bottom view illustrating one example of an LED chip of an LED display lighting device according to the present invention, in which portions other than the peripheral area of the LED chip and exposed bottom portions of electrode structures are indicated by hidden lines.

FIG. 5 is a schematic cross-sectional view illustrating one example of the LED chip of the LED display lighting device according to the present invention and FIG. 6 is a schematic bottom view illustrating one example of the LED chip of the LED display lighting device according to the present invention. In FIG. 6, portions other than the peripheral area of the LED chip and exposed bottom portions of electrode structures are indicated by hidden lines.

Referring to FIGS. 5 and 6, the LED chip 200 is mounted on the substrate 100. The substrate 100 includes a glass-based substrate base 110 and a first electrode part 120a and a second electrode part 120b, both of which are disposed on the substrate base 110.

The LED chip 200 includes a light-transmitting base 210 and n LED cells 220a and 220b disposed under the light-transmitting base 210. It is preferable that the light-transmitting base 210 includes a sapphire substrate. Here, the number (n) of the LED cells is two. Preferably, each of the LED cells 220a and 220b includes a first gallium nitride conductive semiconductor layer 221, a gallium nitride active layer 222, and a second gallium nitride conductive semiconductor layer 223 grown in this order on the sapphire substrate. The LED chip 200 is preferably a blue LED chip.

The LED chip 200 includes an interconnection 230 in the form of a layer through which the n LED cells 220a and 220b are connected in series, a first electrode structure 240 through which the first conductive semiconductor layer 221 of the first LED cell 220a is connected to the first electrode part 120a, and a second electrode structure 250 through which the second conductive semiconductor layer 223 of the n-th LED cell 220b is connected to the second electrode part 120b.

The sum of the upper surface areas of the active layers 222 of the n LED cells 220a and 220b is preferably at least 50%, more preferably at least 60% of the upper surface area of the light-transmitting base 210. If the sum of the upper surface areas of the active layers 222 of the LED cells 220a and 220b is less than 50% of the upper surface area of the light-transmitting base 210, poor efficiency is caused and a relatively dark region is generated.

The first electrode structure 240 includes a first upper electrode pad 241 and a first lower electrode pad 243. The second electrode structure 250 includes a second upper electrode pad 251 and a second lower electrode pad 253. Each of the LED chips 200 includes a light-transmitting insulating layer 260 electrically insulating the first upper electrode pad 241, the second upper electrode pad 251, and the interconnection 230, lower reflective layers 271 and 272 formed on the lower surface of the light-transmitting insulating layer 260 and the lower surfaces of the LED cells 220a and 220b, respectively, a first via 242 penetrating the light-transmitting insulating layer 260 to connect the first upper electrode pad 241 and the first lower electrode pad 243, and a second via 252 penetrating the light-transmitting insulating layer 260 to connect the second upper electrode pad 251 and the second lower electrode pad 253.

According to a preferred embodiment of the present invention, the first lower reflective layer 271 is formed on the lower surface of the light-transmitting insulating layer 260 and the second lower reflective layer 272 is formed on the lower surfaces of the LED cells 220a and 220b. One of the first lower reflective layer 271 and the second lower reflective layer 272 may be omitted. The first or second lower reflective layer 271 or 272 may be a distributed Bragg reflector (DBR) consisting of high refractive index layers and low refractive index layers stacked alternately and whose transmittance and reflectance are determined by the number of repeated stacks of the constituent layers. A low reflectance of light by the first or second lower reflective layer 271 or 272 can be compensated by the other lower reflective layer 272 or 271. The first lower reflective layer 27 covers not only the lower regions of the LED cells 220a and 220b, but also the region between the LED cells 220a and 220b. Thus, the first lower reflective layer 272 can upwardly reflect light emitted through the side surfaces of the LED cells 220a and 220b. That is, the first lower reflective layer 271 is formed on the lower surface of the light-transmitting insulating layer 260 completely covering the n LED cells 220a and 220b and the lower surface of the light-transmitting base 210 to upwardly reflect the majority of light emitted downward from the n LED cells 220a and 220b.

The light-transmitting insulating layer 260 is illustrated as a single layer for convenience of illustration, but in actuality has a multilayer structure. In particular, the interconnection 230 can be interposed between an upper insulating layer and a lower insulating layer.

The ratio of the area of the first lower electrode pad 243 to the area of the first electrode part 120a of the substrate 100 is preferably adjusted to 1:1 and the ratio of the area of the second lower electrode pad 253 to the area of the second electrode part 120b of the substrate 100 is preferably adjusted to 1:1. Since the first electrode part 120a and the second electrode part 120b are formed on the glass-based substrate base 110 that does not undergo thermal shrinkage deformation during bonding, both the ratio of the area of the first lower electrode pad 243 to the area of the first electrode part 120a and the ratio of the area of the second lower electrode pad 253 to the area of the second electrode part 120b can be adjusted to 1:1. A first bonding part 310 is interposed between the first electrode part 120a and the first lower electrode pad 243 and a second bonding part 320 is interposed between the second electrode part 120b and the second lower electrode pad 253. The first bonding part 310 and the second bonding part 320 are preferably formed using an anisotropic conductive film bonding (ACF) or anisotropic conductive bonding (ACA) material.

The LED chips 200 attached in a predetermined arrangement to a pressure-sensitive adhesive sheet (not illustrated) can be mounted on the substrate 100 by push or roll transfer. Before the transfer, a predetermined pattern is formed using an ACA or ACF material on the substrate 100 through a mask. After the transfer, the first bonding portion 310 and the second bonding portion 320 area formed using metal balls in the ACA material or a metal-coated polymer in the ACF material by applying a predetermined temperature and a predetermined pressure to the ACA or ACF material.

The lower reflective layer 271 is preferably a distributed Bragg reflector (DBR) consisting of high refractive index layers and low refractive index layers stacked alternately. Each of the high refractive index layers and low refractive index layers has an optical thickness corresponding to approximately one-quarter of the central wavelength ($\lambda$). This alternate stacking of the high refractive index layers and low refractive index layers allows the DBR to have a high reflectance in a spectral range including the central wavelength. For example, the DBR may be formed by alternately stacking $SiO_2$ layers having a refractive index of ~1.47 as the low refractive index layers and $TiO_2$ layers having a refractive index of ~2.41 as the high refractive index layers. The $SiO_2$ layers as the low refractive index layers and the $TiO_2$ layers as the high refractive index layers serve as dielectric layers and have the advantages of high light transmittance, easy deposition, and relatively large difference in refractive index. When one $SiO_2$ layer and the adjacent $TiO_2$ layer are defined as one pair, 24 pairs of the $SiO_2$ and $TiO_2$ layers ensure a reflectance of 98% for blue light emitted from the LED chip. The number of the pairs consisting of the low refractive index layers and the high refractive index layers may be adjusted depending on the number of the LED cells 220a and 220b in the LED chip 200 and/or the distances between the LED cells 220a and 220b.

The LED chip 200 may further include an upper reflective layer 280 formed on the upper surface of the light-transmitting base 210. The upper reflective layer 280 may be formed in a central area on the light-transmitting base 210 such that a peripheral open area is formed on the upper surface of the light-transmitting base 210, as illustrated in FIG. 5 and (a) of FIG. 9. If the upper reflective layer 280 is not formed, a relatively large amount of light is emitted through the central area. The formation of the upper reflective layer 280 contributes to distributing light entering the central area to the surroundings. The upper reflective layer 280 may be formed covering the entire upper surface of the light-transmitting base 210 such that an increased amount of light is emitted to the surroundings, as illustrated in (b) of FIG. 9. In this case, light is emitted through the side surfaces of the light-transmitting base and the side surfaces of the LED cells. As illustrated in (c) of FIG. 9, the upper reflective layer 280 may be formed such that a central open area is formed on the upper surface of the light-transmitting base 210. The shape, size, and arrangement of the upper reflective layer 280 are determined in consideration of light efficiency and light diffusion angle.

Figure 9:
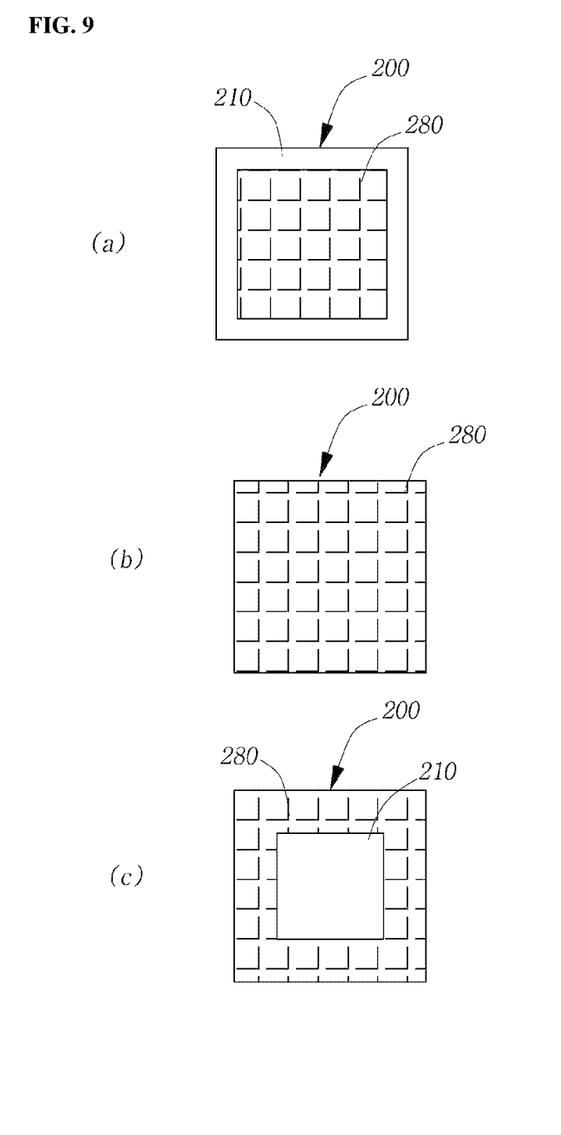
FIG. 9 illustrates (a), (b), and (c) several examples of upper reflective layers that can be applied to the upper surface of an LED chip of an LED display lighting device according to the present invention.

The upper reflective layer 280 is preferably a DBR consisting of high refractive index layers and low refractive index layers stacked alternately. The upper reflective layer 280 has an optical thickness corresponding to approximately one-quarter of the central wavelength ($\lambda$). This alternate stacking of the high refractive index layers and low refractive index layers allows the DBR to have a desired reflectance in a spectral range including the central wavelength. For example, the DBR may be formed by alternately stacking $SiO_2$ layers having a refractive index of ~1.47 as the low refractive index layers and $TiO_2$ layers having a refractive index of ~2.41 as the high refractive index layers. In particular, the transmittance of the DBR is adjusted to approximately 10 to 30%, most preferably 20%, to prevent the generation of a dark portion in the central region thereof. The transmittance of the DBR can be adjusted by varying the number of pairs of the high refractive index layers and the low refractive index layers stacked alternately.

As illustrated in FIGS. 5 and 6, the two LED cells 220a and 220b of the LED chip 200 are arranged in a row. However, the number (n) of the LED cells connected in series in the LED chip is not limited to two and may be two or greater (n≥2). The arrangement of the LED cells may vary.

Figure 7:
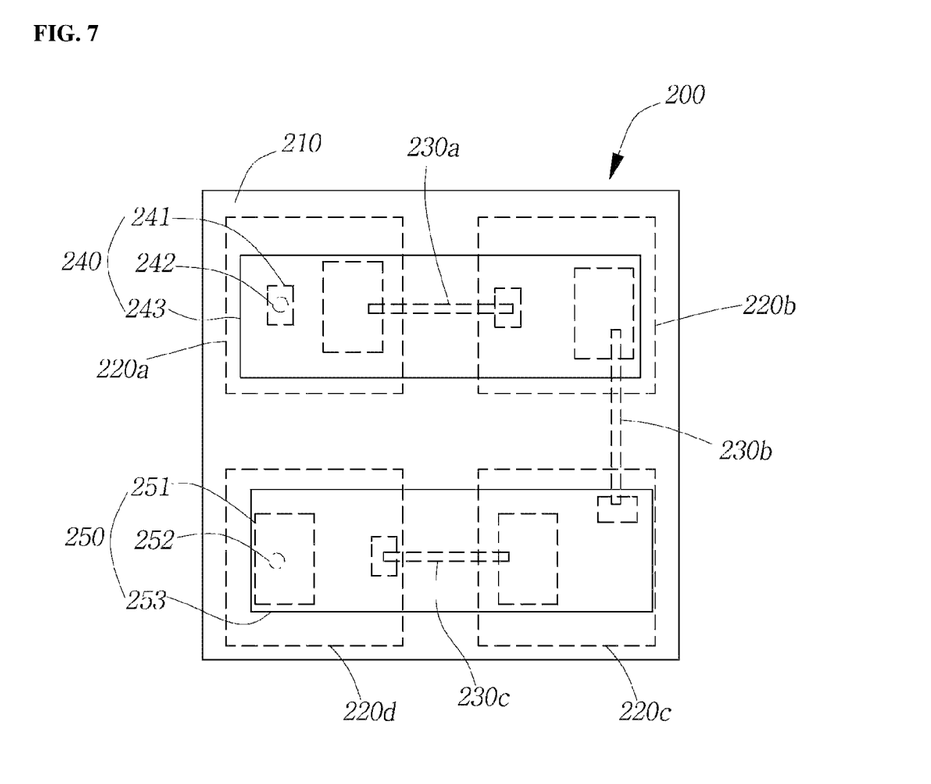
FIG. 7 is a bottom view illustrating another example of an LED chip of an LED display lighting device according to the present invention, in which portions other than the peripheral area of the LED chip and exposed bottom portions of electrode structures are indicated by hidden lines.
Figure 8:
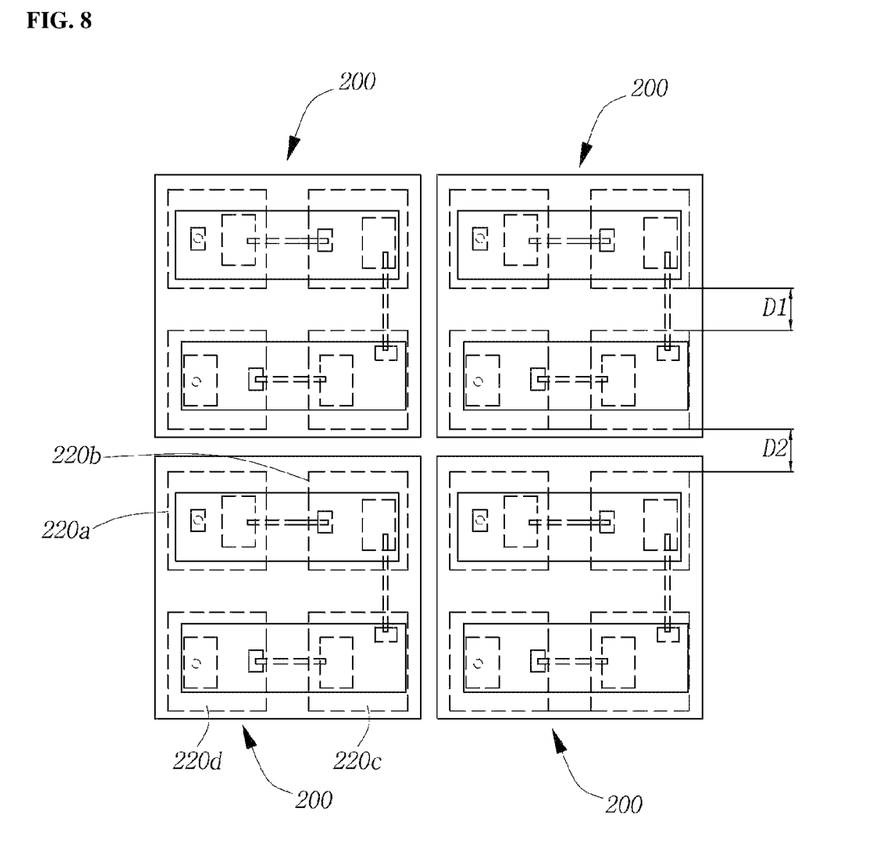
FIG. 8 illustrates an arrangement of LED chips, each of which is illustrated in FIG. 7.

FIG. 7 illustrates an LED chip 200 including four LED cells 220a, 220b, 220c, and 220d arranged in two columns and two rows. FIG. 8 illustrates an arrangement of LED chips 200 in a matrix. Each of the LED chips 200 is the same as that illustrated in FIG. 7.

Referring to FIGS. 7 and 8, the LED chip 200 includes a sapphire substrate as a light-transmitting base 210 and four LED cells 220a, 220b, 220c, and 220d arranged in a matrix under the light-transmitting base 210. Each of the LED cells 220a, 220b, 220c, and 220d includes a first gallium nitride conductive semiconductor layer, a gallium nitride active layer, and a second gallium nitride conductive semiconductor layer grown in this order on the sapphire substrate. The LED chip 200 includes first, second, and third interconnections 230a, 230b, and 230c through which the four LED cells 220a, 220b, 220c, and 220d are connected in series, a first electrode structure 240 through which the first conductive semiconductor layer of the first LED cell 220a is connected to a first electrode part on the substrate, and a second electrode structure 250 through which the second conductive semiconductor layer of the fourth LED cell 220d is connected to a second electrode part on the substrate.

Also here, the sum of the upper surface areas of the active layers 222 of the four LED cells 220a, 220b, 220c, and 220d is preferably at least 50%, more preferably at least 60% of the upper surface area of the light-transmitting base 210.

The first electrode structure 240 includes a first upper electrode pad 241 and a first lower electrode pad 243. The second electrode structure 250 includes a second upper electrode pad 251 and a second lower electrode pad 253. Each of the LED chips 200 includes a light-transmitting insulating layer electrically insulating the first upper electrode pad 241, the second upper electrode pad 251, and the interconnections 230a, 230b, and 230c, a lower reflective layer formed on the lower surface of the light-transmitting insulating layer, a first via 242 penetrating the light-transmitting insulating layer and the lower reflective layer to connect the first upper electrode pad 241 and the first lower electrode pad 243, and a second via 252 penetrating the light-transmitting insulating layer and the lower reflective layer to connect the second upper electrode pad 251 and the second lower electrode pad 253. The lower reflective layer is formed on the lower surface of the light-transmitting insulating layer completely covering the four LED cells 220a, 220b, 220c, and 220d and the lower surface of the light-transmitting base 210 to upwardly reflect the majority of light emitted downward from the four LED cells 220a, 220b, 220c, and 220d.

Referring to FIG. 8, the LED chips 200 are arranged in a matrix. The distance D2 between the two adjacent LED cells of the two adjacent LED chips and the distance D1 between the two adjacent LED cells in each LED chip are within the error range. That is, the distances between all LED cells arranged over the substrate are almost the same within the error range. This arrangement can provide overall uniform light. The distance D1 or D2 between the LED cells is preferably 10 μm or less.

Figure 10:
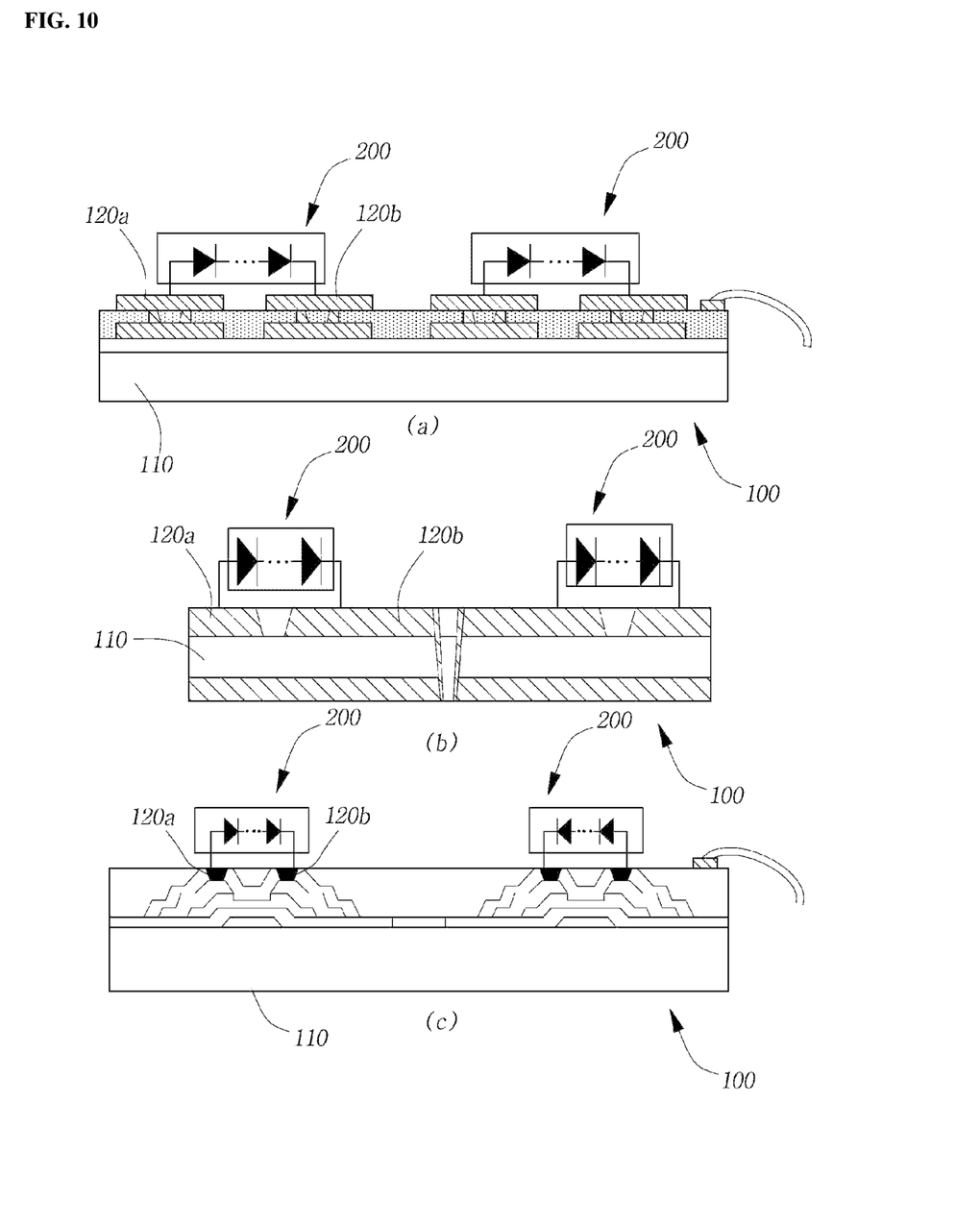
FIG. 10 illustrates (a), (b), and (c) several examples of substrates that can be applied to an LED display lighting device of the present invention.

(a), (b), and (c) of FIG. 10 illustrate several examples of substrate 100s that can be applied to the LED display lighting device of the present invention.

Each of the substrates 100 illustrated in (a), (b) and (c) of FIG. 10 includes a glass-based substrate base 110, a first electrode part 120a disposed on the substrate base 110 and bonded to a first electrode pad of an LED chip 200, and a second electrode part 120b disposed on the substrate base 110 and bonded to a second electrode pad of the LED chip 200. Each of the substrates 100 illustrated in (a), (b) and (c) of FIG. 10 includes an electrically insulating layer electrically insulating the first electrode part 120a and the second electrode part 120b. The substrates without TFTs illustrated in (a) and (b) of FIG. 10 and the substrate with TFTs illustrated in (c) of FIG. 10 are also applicable to the present invention. The use of the glass-based substrate base 110 enables the formation of fine pitch electrode separation lines between the first electrode part 120a and the second electrode part 120b, making it possible to bond the first or second electrode structure of the LED chip to the first or second electrode part 120a or 120b of the substrate in an area ratio of 1:1. In addition, the use of the glass-based substrate base 110 enables circuit simplification through simultaneous deposition of TFTs or FETs, increases the flatness of the substrate, and contributes to minimizing thermal deformation. As illustrated in (a) and (b) of FIG. 10, the first electrode part 120a and the second electrode part 120b are formed on the substrate without TFTs by applying an insulating material onto the glass-based substrate base 110 and plating Cu thereon. For the substrate with TFTs illustrated in (c) of FIG. 10, semiconductor technology is used to precisely form the first electrode part 120a and the second electrode part 120b on the TFTs, facilitating adjustment of the area ratio between each of the electrode pads of the LED chips and the corresponding one of the electrode parts of the substrate to 1:1.

What is claimed is:

1. An LED display lighting device comprising:
a substrate comprising a substrate base and a first electrode part and a second electrode part, both of which are disposed on the substrate base;
a plurality of LED chips arranged in a matrix on the substrate; and
a diffusion plate covering the upper portions of the LED chips,
wherein each of the LED chips comprises:
a light-transmitting base;
n LED cells disposed under the light-transmitting base and each comprising a first conductive semiconductor layer, an active layer, and a second conductive semiconductor layer;
an interconnection through which the n LED cells are connected in series;
a first electrode structure through which the first conductive semiconductor layer of the first LED cell is connected to the first electrode part;
a second electrode structure through which the second conductive semiconductor layer of the n-th LED cell is connected to the second electrode part; and
an upper reflective layer formed on the upper surface of the light-transmitting base.

2. The LED display lighting device according to claim 1, wherein the substrate base is glass.

3. The LED display lighting device according to claim 1, wherein the distance between the two adjacent LED cells of the two adjacent LED chips is the same as that between the two adjacent LED cells in each LED chip.

4. The LED display lighting device according to claim 1, wherein the light-transmitting base comprises a sapphire substrate, and the first conductive semiconductor layer, the active layer, and the second conductive semiconductor layer are gallium nitride semiconductor layers grown on the sapphire substrate.

5. The LED display lighting device according to claim 1, wherein the first electrode structure comprises a first upper electrode pad and a first lower electrode pad, and the second electrode structure comprises a second upper electrode pad and a second lower electrode pad.

6. The LED display lighting device according to claim 5, wherein each of the LED chips comprises: a light-transmitting insulating layer electrically insulating the first upper electrode pad, the second upper electrode pad, and the interconnection; a lower reflective layer formed on the lower surfaces of the LED cells or the lower surface of the light-transmitting insulating layer; a first via penetrating the light-transmitting insulating layer to connect the first upper electrode pad and the first lower electrode pad; and a second via penetrating the light-transmitting insulating layer to connect the second upper electrode pad and the second lower electrode pad.

7. The LED display lighting device according to claim 1, wherein the upper reflective layer has a peripheral open area.

8. The LED display lighting device according to claim 1, wherein the upper reflective layer has a central open area.

9. The LED display lighting device according to claim 1, wherein the upper reflective layer covers the entire upper surface of the light-transmitting base.

10. The LED display lighting device according to claim 5, wherein the ratio of the area of the first electrode part to the area of the first lower electrode pad is 1:1 and the ratio of the area of the second electrode part to the area of the second lower electrode pad is 1:1.

11. An LED display lighting device comprising:
a substrate comprising a substrate base and a first electrode part and a second electrode part, both of which are disposed on the substrate base;
a plurality of LED chips arranged in a matrix on the substrate; and
a diffusion plate covering the upper portions of the LED chips,
wherein each of the LED chips comprises:
a light-transmitting base;

n LED cells disposed under the light-transmitting base and each comprising a first conductive semiconductor layer, an active layer, and a second conductive semiconductor layer;

an interconnection through which the n LED cells are connected in series;

a first electrode structure through which the first conductive semiconductor layer of the first LED cell is connected to the first electrode part;

a second electrode structure through which the second conductive semiconductor layer of the n-th LED cell is connected to the second electrode part; and an upper DBR disposed on the upper surface of the light-transmitting base.

12. An LED display lighting device comprising:

a substrate comprising glass and a first electrode part and a second electrode part, both of which are disposed on the glass;

a plurality of LED chips arranged in a matrix on the substrate; and a diffusion plate covering the upper portions of the LED chips, wherein each of the LED chips comprises:

a light-transmitting base;

n LED cells disposed under the light-transmitting base and each comprising a first conductive semiconductor layer, an active layer, and a second conductive semiconductor layer;

an interconnection through which the n LED cells are connected in series;

a first electrode structure through which the first conductive semiconductor layer of the first LED cell is connected to the first electrode part;

a second electrode structure through which the second conductive semiconductor layer of the n-th LED cell is connected to the second electrode part; and an upper reflective layer formed on the upper surface of the light-transmitting base and a peripheral or central open area, wherein the distance from the upper surface of the substrate to the lower surface of the diffusion plate is not larger than 1 mm.

13. The LED display lighting device according to claim 12, wherein the distance between the two adjacent LED cells of the two adjacent LED chips is the same as that between the two adjacent LED cells in each LED chip.

14. The LED display lighting device according to claim 12, wherein the light-transmitting base comprises a sapphire substrate, and the first conductive semiconductor layer, the active layer, and the second conductive semiconductor layer are gallium nitride semiconductor layers grown on the sapphire substrate.

15. The LED display lighting device according to claim 12, wherein the first electrode structure comprises a first upper electrode pad and a first lower electrode pad, the second electrode structure comprises a second upper electrode pad and a second lower electrode pad, and each of the LED chips comprises: a light-transmitting insulating layer electrically insulating the first upper electrode pad, the second upper electrode pad, and the interconnection; a lower reflective layer formed on the lower surfaces of the LED cells or the lower surface of the light-transmitting insulating layer; a first via penetrating the light-transmitting insulating layer to connect the first upper electrode pad and the first lower electrode pad; and a second via penetrating the light-transmitting insulating layer to connect the second upper electrode pad and the second lower electrode pad.

16. The LED display lighting device according to claim 12, wherein the upper reflective layer covers the entire upper surface of the light-transmitting base.

17. The LED display lighting device according to claim 12, wherein the first electrode part is in contact with the first electrode structure in a 1:1 area ratio and the second electrode part is in contact with the second electrode structure in a 1:1 area ratio.

18. The LED display lighting device according to claim 12, wherein the upper reflective layer comprises a DBR having high refractive index layers and low refractive index layers stacked alternately.

* * * * *